United States Patent [19]

Ogihara et al.

[11] Patent Number: 4,965,660
[45] Date of Patent: Oct. 23, 1990

[54] INTEGRATED CIRCUIT PACKAGE HAVING HEAT SINK BONDED WITH RESINOUS ADHESIVE

[75] Inventors: Satoru Ogihara; Hironori Kodama; Nobuyuki Ushifusa, all of Hitachi; Kanji Otsuka, Higashiyamato, all of Japan

[73] Assignee: Hitachi, Ltd., Tokyo, Japan

[21] Appl. No.: 364,537

[22] Filed: Jun. 12, 1989

Related U.S. Application Data

[63] Continuation of Ser. No. 243,144, Sep. 9, 1988, abandoned, which is a continuation of Ser. No. 68,777, Jun. 29, 1987, abandoned, which is a continuation of Ser. No. 652,910, Sep. 21, 1984, abandoned.

[30] Foreign Application Priority Data

Sep. 22, 1983 [JP] Japan ................................ 58-175958

[51] Int. Cl.⁵ ............................................. H01L 23/02
[52] U.S. Cl. .......................................... 357/81; 357/71; 357/72; 357/80
[58] Field of Search .................... 357/81, 81 C, 80, 71, 357/72, 61, 64

[56] References Cited

U.S. PATENT DOCUMENTS

| | | | |
|---|---|---|---|
| 2,817,048 | 12/1957 | Thuermel et al. | 357/81 X |
| 2,850,687 | 9/1958 | Hammes | 357/81 X |
| 2,887,628 | 5/1959 | Zierdt, Jr. | 357/81 X |
| 3,187,226 | 6/1965 | Kates | 357/81 X |
| 4,556,899 | 12/1985 | Kurihara et al. | 357/81 X |
| 4,561,010 | 12/1985 | Ogihara et al. | 357/81 X |

OTHER PUBLICATIONS

No author, "Thermally Conductive Elastomer for Cooling," *IBM Technical Disclosure Bulletin*, vol. 28, No. 4, Sep. 1985, p. 1490.

*Primary Examiner*—William Mintel
*Attorney, Agent, or Firm*—Antonelli, Terry, Stout & Kraus

[57] ABSTRACT

An integrated circuit package produced by bonding a rear surface of an insulating substrate enclosed in the package to a heat sink such as a cooling fin by a resinous adhesive, which may include one or more fillers, having a Young's modulus of 500 kg/cm² or less when formed into a film, has high reliability at the bonding portion and withstands without damages even if subjected to thermal shocks.

11 Claims, 2 Drawing Sheets

INTEGRATED CIRCUIT PACKAGE HAVING HEAT SINK BONDED WITH RESINOUS ADHESIVE

This application is a Continuation of application Ser. No. 243,144, filed Sept. 9, 1988, which is a continuation of application Ser. No. 068,777, filed June 29, 1987, which is a continuation of application Ser. No. 652,910, filed Sept. 21, 1984, all now abandoned.

BACKGROUND OF THE INVENTION

This invention relates to an integrated circuit package, and more particularly to an integrated circuit package having good heat dissipation properties by bonding a heat sink such as a cooling fin to a ceramic package.

Integrated circuit packages (i.e. packaged integrated circuit devices) comprising an insulating substrate made of ceramics, a cap, and a sealing material for sealing the cap and the insulating substrate to form a small hermetic chamber which encloses at least one semiconductor element, lead members introduced from the outside of the chamber and wires electrically connecting the semiconductor element and the lead members, and a cooling fin affixed to a rear surface of the insulating substrate are widely used today.

A problem arised by using such ceramic packages is very poor heat dissipation properties when heat is produced in the semiconductor element. This is a large obstacle to making semiconductor elements larger in capacity, higher in integration and smaller in size. Therefore, it is required in the integrated circuit packages that ceramics used as insulating substrates for mounting one or more semiconductor elements thereon have excellent electrical insulating properties as well as excellent thermal conductivity. It is also desired that a material used for the insulating substrate has a thermal expansion coefficient very close to that of silicon semiconductor and large mechanical strength.

As an insulating substrate satisfying the abovementioned conditions to some extent, there is used now an alumina sintered body. But the alumina sintered body has a thermal conductivity of as low as 0.05 cal/cm-.sec.°C. Therefore, the alumina sintered body is not a preferable material from the viewpoint of heat dissipation properties of the semiconductor element.

On the other hand, in order to improve the heat dissipation properties of a semiconductor element enclosed in a ceramic package from the viewpoint of structure, a process is proposed wherein a semiconductor 1 is disposed on a copper stud 31 extending out of a package through an insulating substrate 4 as shown in FIG. 1 [IEEE TRANSACTIONS ON COMPONENTS, HYBRIDS, AND MANUFACTURING TECHNOLOGY Vol. CHMT.-4, No. 2, 166(1981)]. In FIG. 1, in the package comprising the substrate 4, a cap 5 and a sealing material 6, the semiconductor 1 is bonded to the copper stud 31 via a supporting plate 32 made of molybdenum by solder layer 7 in order to relax stress caused by a difference in thermal expansions of the semiconductor and the copper stud. The semiconductor element 1 is electrically connected to a terminal of a lead piece 3 adhered to the substrate 4 by bonding wires 2. The heat produced in the semiconductor element 1 is conducted to the outside of the package via the supporting plate 32 and the copper stud 31 and further is dissipated by a cooling fin 9. In such a structure, since all the heat transfer path from the semiconductor 1 to the cooling fin 9 is made of a metal excellent in thermal conductivity, there can be obtained an integrated circuit package having high heat dissipation properties. But this process has defects in that (1) assembly steps increase due to an increase of the number of parts and a complicated structure, and (2) since parts made of copper, molybdenum or the like having larger specific gravities are used, the weight of products increases to make the disposal of the products on printed wiring boards and the like troublesome.

In order to overcome such defects, a packaged integrated circuit device is proposed which uses an insulating substrate made of silicon carbide ceramic having a high thermal conductivity and a thermal expansion coefficient very close to that of silicon in order to make the heat dissipation properties better (U.S. patent application Ser. No. 572,518). But according to this packaged integrated circuit device, since a cooling fin made of aluminum or its alloy is bonded to a rear surface of the insulating substrate made of silicon carbide ceramic by using an epoxy resin or the like resin adhesive having a higher Young's modulus when formed into a film, there arises a problem in that cracks are produced on a glass layer in the glass sealed package when subjected to cooling and heating cycles.

SUMMARY OF THE INVENTION

It is an object of this invention to provide an integrated circuit package having enhanced reliability at the bonding portion between an insulating substrate made of silicon carbide or the like excellent in heat dissipation properties and a heat sink such as a cooling fin.

This invention provides an integrated circuit package comprising an insulating substrate, a cap and a sealing glass sealing the cap with the insulating substrate to form a hermetic casing which encloses at least one semiconductor element mounted on a front surface of the insulating substrate, lead members introduced from the outside of the casing and wires electrically connecting the semiconductor element with end portions of the lead members, and a heat sink bonded to a rear surface of the insulating substrate, characterized in that the heat sink is bonded to the rear surface of the insulating substrate by using a resinous adhesive having a Young's modulus of 500 kg/cm$^2$ or less when formed into a film.

DESCRIPTION OF THE PREFERRED EMBODIMENTS

Features of this invention are to use a special resinous adhesive with high elasticity for bonding a heat sink such as a cooling fin made of aluminum or its alloy to the insulating substrate preferably made of silicon carbide in order to relax thermal stress caused by a difference in thermal expansion of the heat sink and the insulating substrate while maintaining the adhesive strength of the adhesive and to prevent the production of cracks on sealing glass layers.

In this invention, the package to contain an integrated circuit that includes a semiconductor element having a plurality of leads connected to the element is a conventional one.

Figure 1:
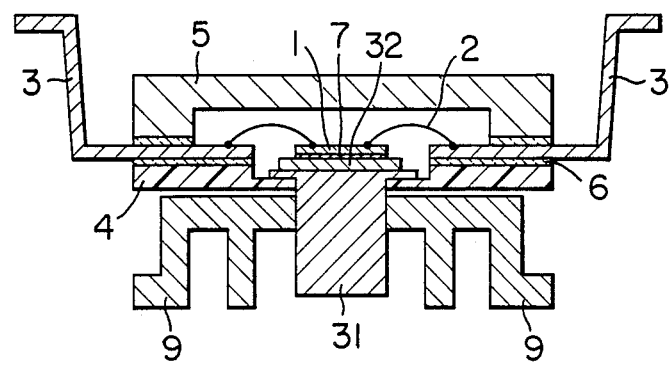
FIG. 1 is a cross-sectional view of an integrated circuit package of the prior art.

As the insulating substrate mounting at least one semiconductor element thereon, there can be used an insulating substrate having a large thermal conductivity and a thermal expansion coefficient close to that of the semiconductor element. Examples of such an insulating substrates are those made of silicon carbide series ceramics or beryllia series ceramics. Among them, particularly preferable ones are sintered bodies of insulating silicon carbide series ceramics containing silicon carbide as a major component and 0.05 to 5% by weight (in terms of beryllium) of at least one member selected from the group consisting of beryllium, beryllium oxide and beryllium compounds which can be converted to beryllium oxide on heating, and having a relative density of 90% or more based on the theoretical density. The thermal expansion coefficient of these sintered bodies is 35 to $40 \times 10^{-7}/°C$. which value is close to that of silicon. The thermal conductivity of these sintered bodies is 0.2 to 0.7 cal/cm.sec.°C., which value is 4 to 12 times as large as that of alumina ceramic substrate heretofore being used. Further, since the thermal expansion coefficient of the silicon carbide ceramic is close to that of silicon, when a semiconductor element is disposed on the insulating substrate via an adhesive layer, thermal stress produced by a difference in thermal expansion of the semiconductor element and the insulating substrate is very small. Therefore, it is not necessary to interpose a stress relaxing material between the substrate and the element as shown in FIG. 1. Further, the use of silicon carbide as the insulating substrate is preferable in order to enhance the heat dissipation properties of the semiconductor element. Therefore, it becomes possible to effectively dissipate the heat produced in the semiconductor element by directly mounting the semiconductor element on such a silicon carbide ceramic insulating substrate and bonding a heat sink to the silicon carbide ceramic insulating substrate via an adhesive.

In this invention, as the heat sink, there can be used conventional ones made of materials conventionally used. For example, aluminum and its alloy are preferable from the viewpoints of light weight and good thermal conductivity. It is also possible to use copper and its alloys or other metals such as gold, silver, etc. and their alloys. The heat sink can take a plate form, but the fin structure is more preferable from the viewpoint of heat dissipation properties.

As the resinous adhesive for bonding the heat sink to the insulating substrate made of preferably silicon carbide ceramics, that having a Young's modulus of 500 kg/cm$^2$ or less when formed into a film as an adhesive layer should be used. By using the adhesive having high elasticity in terms of Young's modulus of 500 kg/cm$^2$ or less, more preferably 400 to 20 kg/cm$^2$, the thermal stress produced by the difference in thermal expansion between the package and the heat sink can be relaxed without causing cracks on the sealing glass layer. When the Young's modulus is more than 500 kg/cm$^2$, the object of this invention cannot be attained.

That is, the thermal expansion coefficient of the package comprising, for example, a silicon carbide insulating substrate and a cap material is influenced by the thermal expansion coefficient of the silicon carbide insulating substrate and is 35 to $40 \times 10^{-7}/°C$. On the other hand, the thermal expansion coefficient of a heat sink made of aluminum materials is about $237 \times 10^{-7}/°C$. and that of a heat sink made of copper materials is about $170 \times 10^{-7}/°C$. Since the difference in thermal expansion coefficient between the package and the heat sink is so large as mentioned above, thermal stress is produced by temperature change at the time of use. The thermal stress thus produced is relaxed by the adhesive having high elasticity, so that cracks on the sealing glass layer used in the package and peeling of the adhesive at the bonding portion of the heat sink can be prevented.

As the resinous adhesive having a Young's modulus of 500 kg/cm$^2$ or less, there can be used silicone resins, nitrile rubber-phenol resins, neoprene-phenol resins, etc. Epoxy resins usually have a Young's modulus of about 10,000 to 36,000 kg/cm$^2$, and thus these cannot be used as adhesive in this invention. Other thermosetting resins such as melamine resins and phenol resins have the Young's modulus of about 25,000 to 35,000, and thus cannot be used as adhesive in this invention. Considering adhesive strength and heat resistance, silicone resin adhesives are preferable. As the silicone resins, there can be used dimethyl silicone resins, methylvinyl silicone resins, methylphenyl silicone resins, and the like silicone resins alone or as a mixture thereof. But among the silicone resins, those having a Young's modulus of more than 500 kg/cm$^2$ cannot be used in this invention. When phenyl groups are introduced into a silicone resin, there is a tendency to lower the Young's modulus due to an increase of the degree of freedom.

As a hardener for the adhesive, there can be used conventionally used ones such as peroxides, e.g. butyl peroxide, butyl perbenzoate, dichlorobenzyl peroxide, etc., vinyl compounds, e.g. methylvinylsiloxane, methylphenylvinylsiloxane, and vinylacrylic acid (e.g. for vinyl addition polymerization system), etc.

The adhesive may contain one or more fillers in order to increase the thermal conductivity. As the fillers, there can be used alumina (Al$_2$O$_3$), beryllia (BeO), silicon carbide (SiC), silica (SiO$_2$), boron nitride (BN), etc., alone or as a mixture thereof. When an adhesive containing a filler is used, the Young's modulus can be measured by forming a film from the fillercontaining adhesive in the same manner as in the case of containing no filler. That is, Young's modulus is measured by using a conventional strainmeter wherein four point bending is employed and conducting the calculation according to the following equation:

$$E = \frac{l(P_2 - P_1)}{Wt^2(\epsilon_{s2} - \epsilon_{s1})}$$

wherein E is Young's modulus (N/m$^2$); P is a load (N); l is a distance between supporting rolls (m); W is the width of the sample (m); t is the thickness of the sample (m); and $\epsilon_s$ is measured strain by using a stain gauge.

By the addition of a filler, the thermal conductivity of the adhesive layer can be improved, but when the amount of filler is too much, the adhesive strength is undesirably lowered. Therefore, a proper amount of filler should be used considering the thermal conductivity, adhesive strength, and the like. Preferable amount of the filler is 20 to 80% by volume, and 30 to 65% by volume is more preferable when the thermal conductivity is particularly taken into consideration.

This invention is explained more in detail referring to the drawings.

Figure 2:
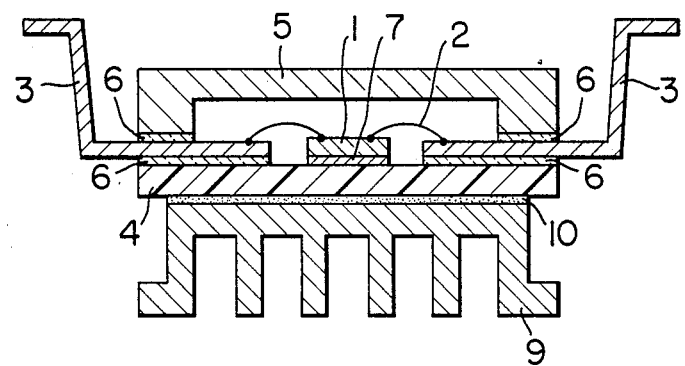
FIGS. 2 to 4 are cross-sectional views of embodiments of the integrated circuit package of this invention.

FIG. 2 is a cross-sectional view showing an example of the integrated circuit package according to this invention. In FIG. 2, a semiconductor element 1 is bonded to the central portion of a front surface of an insulating substrate 4 made of silicon carbide ceramic by a metal solder layer 7 (e.g. a gold paste, gold-tin solder, etc.). A plurality of terminals of leads 3 adhered by a sealing glass layer 6 on the front surface of the insulating substrate are electrically connected to the semiconductor element 1 via bonding wires 2. Other terminals of the leads 3 extend outside the periphery of the insulating substrate 4. The element 1, the bonding wires 2 and the terminals of leads 3 are enclosed by the insulating substrate 4 and a cap 5. Spaces among the cap 5, the insulating substrate 4 and leads 3 are sealed hermetically by the sealing (solder) glass layer 6. A cooling fin 9 is adhered to the rear surface of the insulating substrate 4 via the adhesive layer 10.

The insulating substrate 4 is made of sintered body of silicon carbide ceramics containing BeO in an amount of 0.05 to 5% by weight in terms of Be and the balance being substantially silicon carbide (SiC) and having a density of 90% or higher of the theoretical density. The sintered body of silicon carbide ceramic has electrical insulating properties of $10^3$ $\Omega$·cm or more (room temperature) in terms of electrical resistivity, a thermal conductivity of 0.2 to 0.7 cal/cm·sec·°C., flexural strength of 30 kgf/mm$^2$ or more and a thermal expansion coefficient of $3.5 \times 10^{-7}$/°C.

As the cap material, there can be used ceramics having a thermal expansion coefficient close to that of the silicon carbide ceramics. Examples of such ceramics are ceramics of mullite base (thermal expansion coefficient: $40-55 \times 10^{-7}$/°C.), ceramics of silicon carbide base (thermal expansion coefficient: $33-40 \times 10^{-7}$/°C.), ceramics of cordierite base ($25-35 \times 10^{-7}$/°C.), etc.

As the glass for sealing, there can be used glass preferably having heat resistance of 455° C. or less, since the silicon semiconductors enclosed in the package becomes high in density and narrower in bonding width. Therefore, the package is required to be sealed by using the glass for sealing at 455° C. or lower. Further, the glass for sealing is also required to have a thermal expansion coefficient close to the value of $40-55 \times 10^{-7}$/°C. of the silicon carbide insulating substrate and the cap material. Such special glass having a low thermal expansion coefficient and being able to be used at such a low sealing temperature cannot be obtained from a simple material. It is preferable to use lead borate glass containing $\beta$-eucryptite ($\beta$-Li$_2$O-Al$_2$O$_3$-2SiO$_2$) and/or lead titanate, both showing low thermal expansion, borosilicate glass which is effective for sealing at high temperatures (particularly at 500° to 700° C.) and the like.

As the cooling fin, that made of aluminum is preferable considering the thermal conductivity and the price.

Table 1 shows strength or durability of cooling-fin-affixed packages having the structure as shown in FIG. 2 but changing adhesives having various Young's modulus as shown in Table 1 before and after subjected to a thermal shock test repeating 100 times of a cycle of cooling at $-55°$ C. for 30 minutes, storing at 25° C. for 30 minutes and heating at $+150°$ C. for 30 minutes. The strength or durability of the packages is evaluated by the number of packages producing cracks or He gas leak.

The He gas leak is measured as follows: a package sample is placed under He pressure of 4–5 kg/cm$^2$ for 16 hours. Then, the sample is taken out and heated in air at 150° C. for 4 hours to fly off He from the surface of sample. Then, the amount of He is mass analyzed by using a He-leak detector to detect the presence of a leak on the package. When the package shows a He leak amount of $5 \times 10^{-9}$ atm.cc/sec or less, it is evaluated as good.

TABLE 1

| Run No. | Number of packages | Damaged number after sealing Cracks | Damaged number after sealing He leak | Adhesive for bonding cooling fin Kind | Adhesive for bonding cooling fin Young's modulus (kg/cm$^2$) | After 100 cycles of cooling ($-55°$ C.) and heating ($+150°$ C.) Cracks | After 100 cycles of cooling ($-55°$ C.) and heating ($+150°$ C.) He leak | Rate of undamaged packages |
|---|---|---|---|---|---|---|---|---|
| 1 | 20 | 0 | 0 | Epoxy resin | 36,000 | 16 | 3 | 1/20 |
| 2 | 10 | 0 | 0 | Phenol resin | 35,000 | 9 | 1 | 0/10 |
| 3 | 20 | 0 | 0 | Melamine resin | 25,000 | 18 | 1 | 1/20 |
| 4 | 20 | 0 | 0 | Epoxy resin | 15,000 | 15 | 2 | 3/20 |
| 5 | 20 | 0 | 0 | Epoxy resin | 10,000 | 15 | 3 | 2/20 |
| 6 | 20 | 0 | 0 | Butadiene-styrene | 2,000 | 7 | 3 | 10/20 |
| 7 | 20 | 0 | 0 | Nitrile rubber-phenol resin mixture | 300 | 0 | 0 | 20/20 |
| 8 | 20 | 0 | 0 | Neoprene-phenol resin mixture | 400 | 0 | 0 | 20/20 |
| 9 | 50 | 0 | 0 | Methylphenyl-silicone resin | 500 | 0 | 0 | 50/50 |
| 10 | 20 | 0 | 0 | Methylphenyl-silicone resin | 300 | 0 | 0 | 20/20 |
| 11 | 20 | 0 | 0 | Methylphenyl-silicone resin | 100 | 0 | 0 | 20/20 |
| 12 | 20 | 0 | 0 | Methylphenyl-silicon resin | 70 | 0 | 0 | 20/20 |

As is clear from Table 1, packages of Run Nos. 1 to 6 obtained by using adhesives of epoxy resins, a phenol resin, a melamine resin and butadiene-styrene copolymer, these resins having a Young's modulus of 2000 kg/cm$^2$ or more, have no damage such as cracks or He gas leak after sealing, but some of the packages suffer from cracks or peeling at the portion 6 sealed by the glass or He gas leak after subjected to 100 cycles of cooling and heating test. In contrast, when the Young's modulus of adhesives is 500 kg/cm$^2$ or less as shown in Run Nos. 7 to 12, no cracks are produced at the portion 6 sealed by the glass nor does He gas leak take place even after being subjected to the same 100 cycles of cooling and heating test as mentioned above.

The same excellent results are obtained when fillers as shown in Table 2 are added to the silicone resin adhesives used in Run Nos. 9 to 12. Table 2 shows Young's modulus of the adhesives containing various fillers.

TABLE 2

| Adhesive | Filler | Young's modulus |
|---|---|---|
| Run No. | Kind | Run No. | Kind | Amount (Vol %) | (kg/cm²) |
| 13 | Methylphenyl-silicon resin | 9 | Al₂O₃ | 80 | 500 |
| 14 | Methylphenyl-silicone resin | 10 | Al₂O₃ | 65 | 300 |
| 15 | Methylphenyl-silicone resin | 10 | SiO₂ | 65 | 300 |
| 16 | Methylphenyl-silicone resin | 11 | Al₂O₃ | 50 | 100 |
| 17 | Methylphenyl-silicone resin | 11 | SiC | 50 | 100 |
| 18 | Methylphenyl-silicone resin | 12 | Al₂O₃ | 20 | 50 |

A cooling fin made of aluminum having a heat dissipation area of 13.6 cm² is bonded to a silicon carbide insulating substrate having a size of 21.6 mm×21.6 mm×0.6 mm by using the adhesive of Run No. 10 containing Al₂O₃ filler. The thermal resistivity measured at an air flow rate of 5 m/sec is 7.7° C./W. This value is more excellent than the value of 12° C./W obtained by subjecting the package of FIG. 1 to the same test conditions.

Table 3 shows the same test results as shown in Table 1 by using various silicone resin adhesives containing fillers in various amounts as shown in Table 3.

TABLE 3

| | | Adhesive | | | | After 100 cycles of cooling (−55° C.) and heating (+150° C.) | | | |
|---|---|---|---|---|---|---|---|---|---|
| Run No. | Number of packages | Kind of resin | Amount of hardener*¹ (wt. %) | Filler Kind | Amount Vol. % | Young's modulus (kg/cm²) | Cracks | He leak | Rate of undamaged packages | Evaluation *² |
| 21 | 20 | Dimethyl-silicon resin | 4 | Al₂O₃ | 80 | 1000 | 8 | 5 | 7/20 | x |
| 22 | 20 | Dimethyl-silicon resin | 4 | " | 54 | 800 | 7 | 2 | 11/20 | x |
| 23 | 20 | Dimethyl-silicon resin | 2 | " | 50 | 400 | 0 | 0 | 20/20 | o |
| 24 | 20 | Dimethyl-silicon resin | 1 | " | 60 | 300 | 0 | 0 | 20/20 | o |
| 25 | 20 | Dimethyl-silicon resin | 2 | SiC | 50 | 400 | 0 | 0 | 20/20 | o |
| 26 | 20 | Methylvinyl-silicone resine | 5 | Al₂O₃ | 50 | 700 | 2 | 1 | 17/20 | x |
| 27 | 20 | Methylvinyl-silicone resine | 3 | " | 65 | 550 | 2 | 0 | 18/20 | x |
| 28 | 20 | Methylvinyl-silicone resine | 2 | " | 65 | 500 | 0 | 0 | 20/20 | o |
| 29 | 20 | Methylvinyl-silicone resine | 1 | " | 50 | 300 | 0 | 0 | 20/20 | o |
| 30 | 20 | Methylvinyl-silicone resine | 1 | SiC | 50 | 300 | 0 | 0 | 20/20 | o |
| 31 | 20 | Methylphenyl-silicone resine | 3 | Al₂O₃ | 80 | 500 | 0 | 0 | 20/20 | o |
| 32 | 20 | Methylphenyl-silicone resine | 2 | " | 65 | 300 | 0 | 0 | 20/20 | o |
| 33 | 20 | Methylphenyl-silicone resine | 2 | " | 50 | 100 | 0 | 0 | 20/20 | o |
| 34 | 20 | Methylphenyl-silicone resine | 2 | " | 20 | 50 | 0 | 0 | 20/20 | o |
| 35 | 20 | Methylphenyl-silicone resine | 2 | SiC | 65 | 300 | 0 | 0 | 20/20 | o |
| 36 | 20 | Methylphenyl-silicone resine | 2 | SiC | 50 | 100 | 0 | 0 | 20/20 | o |
| 37 | 20 | Methylphenyl-silicone resine | 1 | Al₂O₃ | 50 | 70 | 0 | 0 | 20/20 | o |
| 38 | 20 | Methylphenyl-silicone resine | 5 | " | 50 | 550 | 5 | 1 | 14/20 | x |

Note
*¹butyl peroxide
*²x: bad, o: good

As is clear from Table 3, even if silicone resins are used, the Young's modulus is not always 500 kg/cm² or less. When the Young's modulus is more than 500 kg/cm², packages are damaged after subjected to the 100 cycles of cooling and heating test as shown in Run Nos. 21, 22, 26, 27 and 38.

Figure 3:
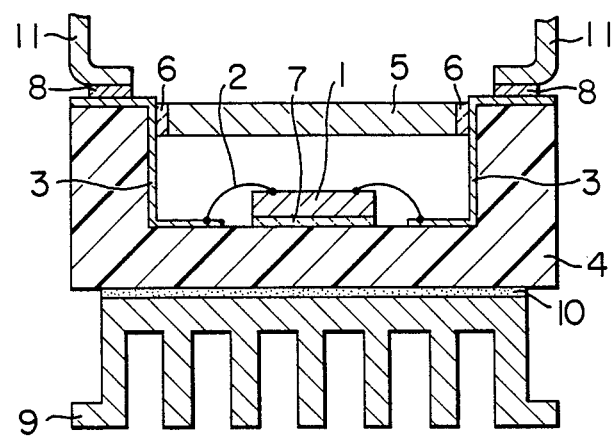
Figure 4:
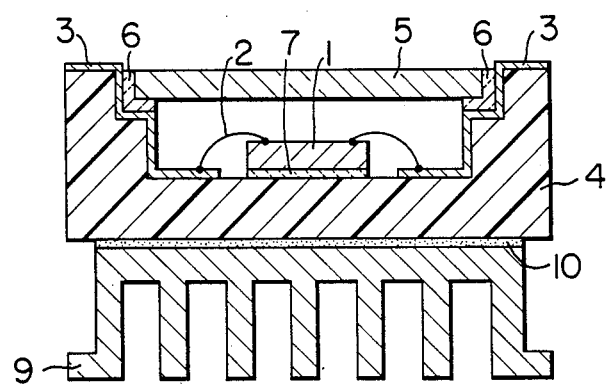

FIGS. 3 and 4 are cross-sectional views showing other examples of the integrated circuit package according to this invention.

In FIGS. 3 and 4, silicon semiconductor element 1 is bonded to the center portion of the inner bottom surface of an insulating substrate 4 made of silicon carbide ceramics and molded in the form of a box via a metallizing layer 7. Terminals of leads 3 are electrically connected to the semiconductor element 1 via bonding wires 2 and other terminals of the leads 3 are rise along the inner standing surface of the insulating substrate and extend to the outside of the periphery of the insulating substrate. An opening portion of the insulating substrate 4 is closed by a cap 5 in the form of a lid. Spaces among the insulating substrate, the cap or the leads are sealed by glass 6. The rear surface of the insulating substrate 4 is bonded to a cooling fin 9 made of aluminum via a silicone resin adhesive 10 (Run No. 23) containing alumina filler in an amount of 50% by volume. In FIG. 3, the leads 3 taken out of the periphery of the insulating substrate 4 are connected to a lead frame 11 via solder layers 8 (lead-tin solder).

The insulating substrate 4 is made of a silicon carbide ceramic containing beryllium in an amount of 0.05 to 5% by weight and the balance being silicon carbide. The cap 5 is made of a ceramic of mullite base having a thermal expansion coefficient of $48 \times 10^{-7}/°C$. The glass for sealing 6 is $PbO-B_2O_5$ series glass containing as filler $PbTiO_3$ and $\beta\text{-}Li_2O\text{-}Al_2O_3\text{-}2SiO_2$, and has a thermal expansion coefficient of $49 \times 10^{-7}/°C$. and a sealing temperature of 450° C.

The produced integrated circuit packages as shown in FIGS. 3 and 4 withstand the 100 cycles of cooling (−55° C.) and heating (+150° C.) test and show no cracks nor He leak and no abnormalites in electrical properties.

As mentioned above, since the rear surface of the insulating substrate and the heat sink are bonded by a resinous adhesive having a Young's modulus of 500 kg/cm$^2$ or less when formed into a film, thermal stress caused by the difference in thermal expansion of the insulating substrate and the heat sink can be relaxed by the adhesive layer present therebetween, which results in making the reliability at the bonding portion high.

What is claimed is:

1. In an integrated circuit package comprising an insulating substrate, a cap and a sealing glass sealing the cap with the insulating substrate to form a hermetic casing which encloses at least one semiconductor element mounted on a front surface of the insulating substrate, lead members introduced from the outside of the casing and wires electrically connecting the semiconductor element with end portions of the lead members, and a heat sink bonded to a rear surface of the insulating substrate, the improvement wherein the cap is made of a ceramic material having a thermal expansion coefficient of 40 to $55 \times 10^{-7}/°C$.; the sealing glass has a thermal expansion coefficient close to 40 to $55 \times 10^{-7}/°C$.; the heat sink has a fin structure and is bonded to the rear surface of the insulating substrate by a silicone resin adhesive having a Young's modulus of 500 kg/cm$^2$ or less when formed into a film, said silicone resin adhesive containing 20 to 80% by volume of one or more fillers in order to increase its thermal conductivity; the thermal expansion coefficient of the insulating substrate is 35 to $40 \times 10^{-7}/°C$., the insulating substrate is made of a sintered body of ceramic material having a thermal conductivity of 0.2 to 0.7 cal/cm.sec.°C. and the heat sink is made of at least one member selected from the group consisting of aluminum and alloys thereof having a thermal expansion coefficient of at least $170 \times 10^{-7}/°C$., whereby the sealing glass is prevented from cracking.

2. An integrated circuit package according to claim 1, wherein the insulating substrate is made of a silicone carbide ceramic.

3. An integrated circuit package according to claim 2, wherein the silicone carbide ceramic is a sintered body containing 0.05 to 5% by weight of at least one member selected from the group consisting of beryllia and beryllia compounds in terms of the weight of beryllia and a balance being substantially silicon carbide.

4. An integrated circuit package according to claim 1, wherein the silicone resin is a dimethyl silicone resin, a methylvinyl silicone resin, a methylphenyl silicone resin, or a mixture thereof.

5. An integrated circuit package according to claim 1, wherein the filler in the silicone resin is alumina, beryllia, silicone carbide, silica, boron nitride, or a mixture thereof.

6. An integrated circuit package according to claim 3, wherein the silicon carbide ceramic has a density of 90% or more of the theoretical density.

7. An integrated circuit package according to claim 1, wherein the Young's modulus of the silicone resin is 20–400 kg/cm$^2$.

8. In an integrated circuit package comprising an insulating substrate, a cap and a sealing glass sealing the cap with the insulating substrate to form a hermetic seal which encloses at least one semiconductor element mounted on a front surface of the insulating substrate, lead members introduced from the outside of the casing and wires electrically connected to the semiconductor element with end portions of the lead members, and a heat sink bonded to a rear surface of the insulating substrate, the improvement wherein the cap is made of ceramic material having a thermal expansion coefficient of 40 to $55 \times 10^{-7}/°C$.; the sealing glass has a thermal expansion coefficient close to 40 to $55 \times 10^{-7}/°C$; the insulating substrate is made of a sintered body of a ceramic material having a thermal conductivity of 0.2 to 0.7 cal/cm.sec.°C; said heat sink has a fin structure and is made of at least one member selected from the group consisting of aluminum and alloys thereof, said heat sink is bonded to the rear surface of the insulating substrate by a silicone resin adhesive having a Young's modulus of 500 kg/cm$^2$ or less when formed into a film, said silicone resin adhesive containing 20 to 80% by volume of one or more fillers in order to increase its thermal conductivity, and the thermal expansion coefficient of the insulating substrate is 35 to $40 \times 10^{-7}/°C$.

9. In an integrated circuit package comprising an insulating substrate, a cap and a sealing glass sealing the cap with the insulating substrate to form a hermetic casing which encloses at least one semiconductor element mounted on a front surface of the insulating substrate, lead members introduced from the outside of the casing and wires electrically connecting the semiconductor element with end portions of the lead members, and a heat sink bonded to a rear surface of the insulating substrate, the improvement wherein the cap is made of a ceramic material having a thermal expansion coefficient of 40 to $55 \times 10^{-7}/°C$.; the sealing glass has a thermal expansion coefficient close to 40 to $55 \times 10^{-7}/°C$.; the insulating substrate is made of a sintered body of ceramic material having a thermal conductivity of 0.2 to 0.7 cal/cm.sec.°C.; said heat sink has a fin structure and is made of at least one member selected from the group consisting of aluminum and alloys thereof, said heat sink is bonded to the rear surface of the insulating substrate by a resinous adhesive having a Young's modulus of 500 kg/cm$^2$ or less when formed into a film, and a thermal expansion coefficient of the insulating substrate is 35 to $40 \times 10^{-7}/°C$.; said resinous adhesive comprising a silicone resin and 20 to 80% by volume of one or more thermally conductive fillers in order to increase its thermal conductivity.

10. An integrated circuit package according to claim 9, wherein the silicone resin is a dimethyl silicone resin, a methylvinyl silicone resin, a methylphenyl silicone resin or a mixture thereof.

11. An integrated circuit package according to claim 10, wherein the filler in the resinous adhesive is alumina, beryllia, silicone carbide, silica, boron nitride or a mixture thereof.

* * * * *